United States Patent
Schlarmann et al.

(10) Patent No.: US 9,090,455 B2
(45) Date of Patent: Jul. 28, 2015

(54) MEMS PRESSURE TRANSDUCER ASSEMBLY

(71) Applicant: FREESCALE SEMICONDUCTOR, INC., Austin, TX (US)

(72) Inventors: Mark E. Schlarmann, Chandler, AZ (US); Yizhen Lin, Cohoes, NY (US)

(73) Assignee: FREESCALE SEMICONDUCTOR, INC, Austin, TX (US)

( * ) Notice: Subject to any disclaimer, the term of this patent is extended or adjusted under 35 U.S.C. 154(b) by 0 days.

(21) Appl. No.: 14/450,870

(22) Filed: Aug. 4, 2014

(65) Prior Publication Data

US 2014/0339656 A1    Nov. 20, 2014

Related U.S. Application Data

(62) Division of application No. 13/400,966, filed on Feb. 21, 2012, now Pat. No. 8,889,451.

(51) Int. Cl.
  *B81B 7/00* (2006.01)
  *B81C 1/00* (2006.01)
  *G01L 9/00* (2006.01)
  *G01L 19/14* (2006.01)
  *B81B 3/00* (2006.01)

(52) U.S. Cl.
  CPC ............ *B81B 7/0048* (2013.01); *B81B 3/0021* (2013.01); *B81B 3/0072* (2013.01); *B81B 7/0058* (2013.01); *B81C 1/00309* (2013.01); *G01L 9/0042* (2013.01); *G01L 9/0052* (2013.01); *G01L 19/147* (2013.01); *B81B 2203/0118* (2013.01); *B81B 2203/0127* (2013.01); *B81B 2203/051* (2013.01); *B81B 2207/115* (2013.01)

(58) Field of Classification Search
  USPC ......................................................... 438/415
  See application file for complete search history.

(56) References Cited

U.S. PATENT DOCUMENTS

| | | | |
|---|---|---|---|
| 7,475,597 B2 | 1/2009 | Brida et al. | |
| 7,661,318 B2 | 2/2010 | Brosh et al. | |
| 8,216,882 B2 | 7/2012 | Lin et al. | |
| 8,304,275 B2 | 11/2012 | Schlarmann et al. | |
| 2003/0151479 A1 | 8/2003 | Stafford et al. | |
| 2005/0127499 A1 | 6/2005 | Harney et al. | |
| 2007/0013036 A1 | 1/2007 | Zhe et al. | |
| 2008/0016683 A1 | 1/2008 | Brida et al. | |
| 2008/0022777 A1 | 1/2008 | Tan et al. | |
| 2008/0290430 A1 | 11/2008 | Mahadevan | |
| 2008/0314723 A1 | 12/2008 | Liu | |
| 2009/0020501 A1 | 1/2009 | Tien et al. | |

(Continued)

*Primary Examiner* — Charles Garber
*Assistant Examiner* — Stanetta Isaac
(74) *Attorney, Agent, or Firm* — Charlene R. Jacobsen (57) ABSTRACT

An assembly (20) includes a MEMS die (22) having a pressure transducer device (40) formed on a substrate (44) and a cap layer (38). A packaging process (74) entails forming the device (40) on the substrate, creating an aperture (70) through a back side (58) of the substrate underlying a diaphragm (46) of the device (40), and coupling a cap layer (38) to the front side of the substrate overlying the device. A trench (54) is produced extending through both the cap layer and the substrate, and the trench surrounds a cantilevered platform (48) at which the diaphragm resides. The MEMS die is suspended above a substrate (26) so that a clearance space (60) is formed between the cantilevered platform and the substrate. The diaphragm is exposed to an external environment (68) via the aperture, the clearance space, and an external port.

20 Claims, 9 Drawing Sheets

(56) References Cited

U.S. PATENT DOCUMENTS

| | | |
|---|---|---|
| 2009/0311819 A1 | 12/2009 | Chang et al. |
| 2010/0049298 A1 | 2/2010 | Hamer et al. |
| 2010/0176465 A1 | 7/2010 | Yama et al. |
| 2011/0062573 A1 | 3/2011 | Zhe et al. |
| 2011/0159627 A1 | 6/2011 | Mantravadi et al. |
| 2012/0001275 A1 | 1/2012 | Chi et al. |
| 2012/0049298 A1 | 3/2012 | Schlarmann et al. |
| 2012/0175747 A1 | 7/2012 | Schlarmann et al. |

MEMS PRESSURE TRANSDUCER ASSEMBLY

TECHNICAL FIELD OF THE INVENTION

The present invention relates generally to microelectromechanical systems (MEMS) device assemblies. More specifically, the present invention relates to MEMS pressure transducer assemblies and a method of packaging for improved stress isolation.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

As the uses for MEMS devices continue to grow and diversify, increasing emphasis is being placed on smaller size and low cost packaging to meet aggressive cost targets. However, there are continuing challenges to be surmounted in the packaging of MEMS devices due at least in part to the necessity for the MEMS devices to interact with the outside environment and the fragility of many types of MEMS devices. The packaging of MEMS sensor applications often uses materials with dissimilar coefficients of thermal expansion. As such, a high thermally induced stress can develop during MEMS device manufacture or operation. These thermal stresses, as well as stresses due to moisture and assembly processes, can result in deformation of the underlying substrate which, in turn, can cause instability of the MEMS device and output shifts in the MEMS device. Thus, a need exists in MEMS device packaging for effectively providing environmental protection for the fragile moving parts of a MEMS device without sacrificing part performance.

Embodiments entail microelectromechanical systems (MEMS) device assemblies and a method of packaging such MEMS device assemblies for improved stress isolation. In particular, MEMS devices are created through the execution of relatively simple methodology to produce cantilevered structures that provide improved package stress isolation. A MEMS device disclosed herein comprises a pressure transducer in which the backside of a movable diaphragm is exposed to an external environment and the sensitive electrical components and traces are isolated from the external environment in a sealed cavity. The methodology additionally allows for the use of low-cost overmolded packaging or cavity packaging that provides the appropriate environmental protection of the MEMS devices without affecting the mechanical motion of the moving parts of the MEMS devices.

Figure 1:
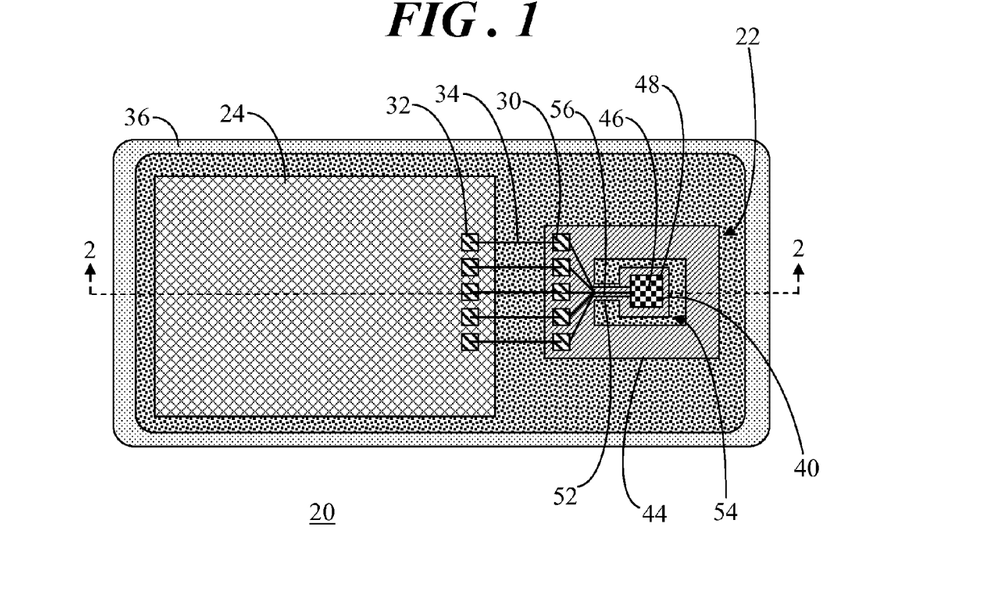
FIG. 1 shows a top view of a microelectromechanical systems (MEMS) chip in accordance with an embodiment.
Figure 2:
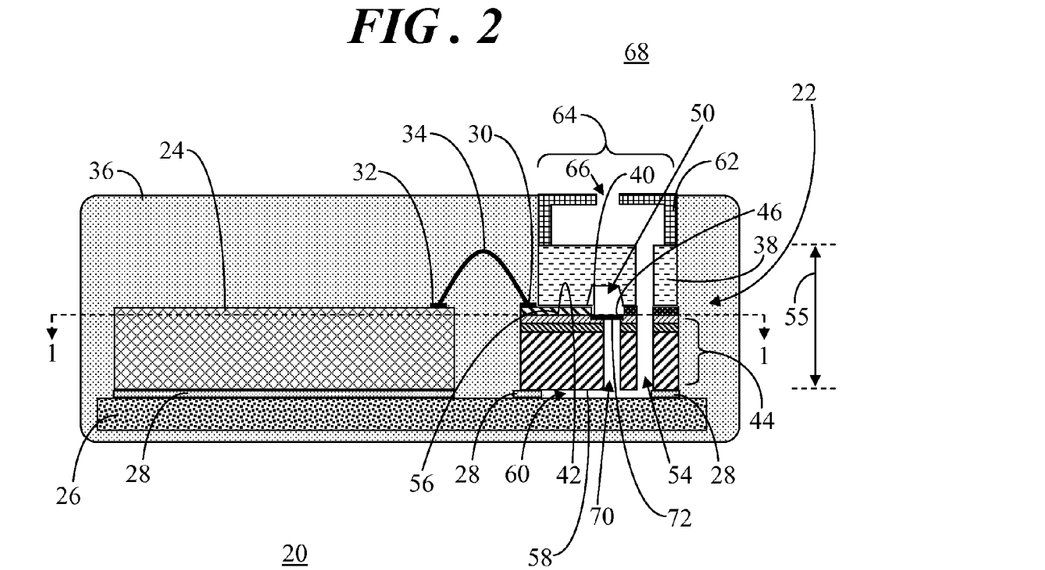
FIG. 2 shows a side sectional view of the MEMS chip.

Referring now to FIGS. 1 and 2, FIG. 1 shows a top view of a microelectromechanical systems (MEMS) chip 20 in accordance with an embodiment, and FIG. 2 shows a side sectional view of MEMS chip 20. The top view of MEMS chip 20 shown in FIG. 1 is taken generally along section lines 1-1 of FIG. 2, and the side sectional view of MEMS chip 20 shown in FIG. 2 is taken along section lines 2-2 of FIG. 1. FIGS. 1-2 and subsequent FIGS. 4-18 are illustrated using various shading and/or hatching to distinguish the different elements of MEMS chip 20, as will be discussed below. These different elements within the structural layers may be produced utilizing current and upcoming micromachining techniques of depositing, patterning, etching, and so forth.

MEMS chip 20 is an assembly that includes at least a MEMS die 22 and an integrated circuit die 24 both of which are attached to a substrate, i.e., a base structure 26. For example, MEMS die 22 and integrated circuit die 24 may be attached to base structure 26 using a die attach material or adhesive 28. Bondwire pads 30 of MEMS die 22 are electrically interconnected with bondwire pads 32 of integrated circuit die 24 via interconnects 34 spanning between bondwire pads 30 and 32. MEMS die 22, integrated circuit die 24, base structure 26, bondwire pads 30, bondwire pads 32, and conductive interconnects 34 may be overmolded with a molding compound 36.

MEMS die 22 includes a cap layer 38 overlying a MEMS device 40. MEMS device 40 of MEMS die 22 is formed on, or alternatively in, a front side 42 of a device substrate, i.e., a device structure 44. A material portion of device structure 44 is removed surrounding an active region 46 of MEMS device 40 to form a cantilevered platform 48 at which active region 46 of MEMS device 40 resides. In an embodiment, cap layer 38 may be a wafer structure that has been appropriately etched, machined, or otherwise processed to include an interior cavity 50, in which MEMS device 40 is located. Accordingly, interior cavity 50 provides a sealed chamber, gap, or air space, between cap layer 38 and active region 46.

Cantilevered platform 48 includes an arm 52 extending from platform 48. One end of arm 52 is fixed to device structure 44, and the opposing end of arm 52 is fixed to cantilevered platform 48. Thus, once a material portion of cap layer 38 and device structure 44 is removed (discussed below), an opening, referred to herein as a trench 54, extends through an entire thickness 55 of cap layer 38 and of device structure 44 and partially surrounds cantilevered platform 48, with one end of arm 52 being the sole attachment point of cantilevered platform 48 to the surrounding device structure 44. Accordingly, the underlying base structure 26 is visible through trench 54 in the top view of MEMS chip 20 provided in FIG. 1.

Conductive traces 56, sometimes referred to as runners, may be formed on arm 52. Traces 56 electrically couple bondwire pads 30 with active region 46 of MEMS device 40 residing on cantilevered platform 48. Although cantilevered platform 48 and trench 54 are shown as being generally rectangular in shape, it should be understood that they may alternatively be formed having differing shapes, rounded corners, and so forth.

A back side 58 of device structure 44, on which MEMS device 40 is formed, is attached to base structure 26. Attachment is performed such that a gap, or clearance space 60, is formed between cantilevered platform 48 and the underlying base structure 26. In the illustrated embodiment, base structure 26 may be a generally planar wafer, leadframe, and the like. Attachment may be performed using adhesive 28 (e.g., epoxy, solder, and so forth) that is thick enough to ensure clearance, i.e., separation, between cantilevered platform 48 and the underlying base structure 26 so as to provide suitable stress isolation for platform 48. Thus, cantilevered platform 48 is suspended above the underlying base structure 26.

MEMS chip 20 may further include a protective cap 62 positioned in an opening 64 formed in molding compound 36 in accordance with a packaging process, discussed below. Protective cap 62 overlies cap layer 38 and trench 54. Protective cap 62 may be provided with a port 66 extending through cap 62, through which active region 46 may be exposed to an environment 68 external to MEMS chip 20, as discussed below. For example, MEMS die 22 may be a pressure transducer configured to sense a pressure stimulus from environment 68.

In an embodiment, active region 46 of MEMS die 22 may be a piezoresistive type pressure sensor. Piezoresistive pressure sensors sense external pressure by means of a piezoresistance effect of a silicon diaphragm as the pressure detecting device. For example, piezoresistive materials (not shown) may be deposited on, diffused into, or otherwise formed on or into front side 42 of device structure 44 at or surrounding active region 46. The piezoresistive elements are typically realized as diffused resistors, and these diffusion resistors are typically connected into a bridge circuit.

An aperture 70 extends through device structure 44 to active region 46 of MEMS device 40. In an embodiment, active region 46 serves as a movable diaphragm for MEMS device 40. As such, active region 46 is alternatively referred to herein as movable diaphragm 46, or simply, diaphragm 46. A back side 72 of movable diaphragm 46 is exposed to external environment 68 via port 66 extending through cap 62, trench 54, clearance gap 60, and aperture 70. As diaphragm 46 moves in response to a pressure stimulus, the pressure signal can be determined from the bridge circuit in accordance with changes in the resistance values of the diffused resistors which are caused by the displacement of diaphragm 46. Although back side 72 of movable diaphragm 46 is exposed to external environment 68 via aperture 70, the more fragile piezoresistive elements (not shown), conductive traces 56, and so forth are encapsulated in sealed cavity 50 and are therefore not exposed to contaminants from external environment 68. This structural configuration results in a high performance, robust MEMS pressure sensing die with effective stress isolation.

In an embodiment, MEMS device 40 of MEMS die 22 represents a piezoresistive pressure transducer configuration. In alternative embodiments, MEMS device 40 represents a variety of one or more MEMS components in which at least one of the components is to be exposed to external environment 68 via aperture 70. Such MEMS components may include, for example, pressure sensors, accelerometers, gyroscopes, microphones, micro fluidic devices, and so forth. Accordingly, active region 46 represents any sensing, or movable, element or elements of a particular MEMS component that is to be exposed to external environment 68 via aperture 70. Integrated circuit die 24 represents the central unit, e.g., a microprocessor, that processes data from MEMS die 22. Thus, integrated circuit die 24 provides "intelligence" built into MEMS chip 20. Although MEMS chip 20 is shown as including only one MEMS die 22 and one integrated circuit die 24, it should be understood that MEMS chip 20 can include any number of MEMS dice 22 and integrated circuit dice 24 in accordance with particular design requirements for MEMS chip 20.

In general, MEMS die 22 is fabricated in accordance with wafer-level packaging methodology that achieves improved package stress isolation of MEMS device 40. MEMS die 22 and integrated circuit die 24 are interconnected via conductive interconnects 34, and the resulting structure is encapsulated in molding compound 36 as discussed in the ensuing methodology.

Figure 3:
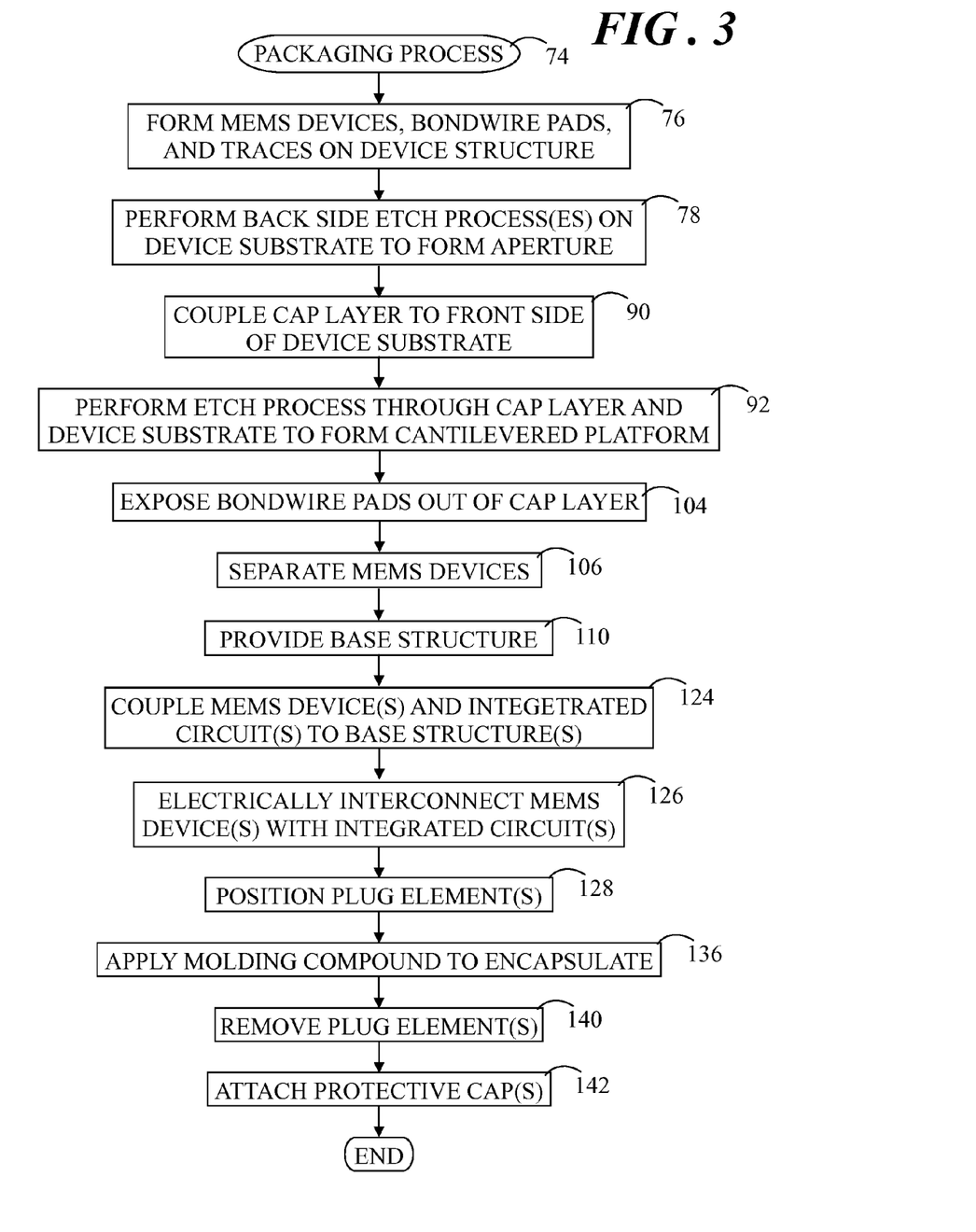
FIG. 3 shows a flowchart of a packaging process for producing and packaging the MEMS chip of FIGS. 1 and 2 in accordance with another embodiment.

FIG. 3 shows a flowchart of a packaging process 74 for producing and packaging MEMS chip 20 (FIGS. 1 and 2) in accordance with another embodiment. Process 74 implements known and developing MEMS micromachining technologies to cost effectively yield MEMS chip 20 that includes at least one MEMS die 22 having improved package stress isolation. Although a single process is shown in which MEMS chip 20 is produced and packaged, it should be understood that multiple entities may execute certain operations of process 74. By way of example, one manufacturer may produce MEMS die 22 and another manufacturer may subsequently package MEMS die 22 to yield MEMS chip 20. Process 74 is described below in connection with the fabrication and packaging of only a few MEMS dice 22 and a few MEMS chips 20. However, it should be understood by those skilled in the art that the following process allows for concurrent wafer-level manufacturing of a plurality of MEMS dice 22. These individual MEMS dice 22 can subsequently be packaged and integrated into an end application that includes integrated circuit die 24.

MEMS chip packaging process 74 begins with a task 76. At task 76, fabrication processes related to the formation of MEMS devices 40, bondwire pads 30, and traces 56 on device structure 44 are performed. A task 78 is performed in connection with task 74. At task 78, a back side etch process is performed on device structure 44 to form aperture 70 (FIG. 2).

Figure 4:
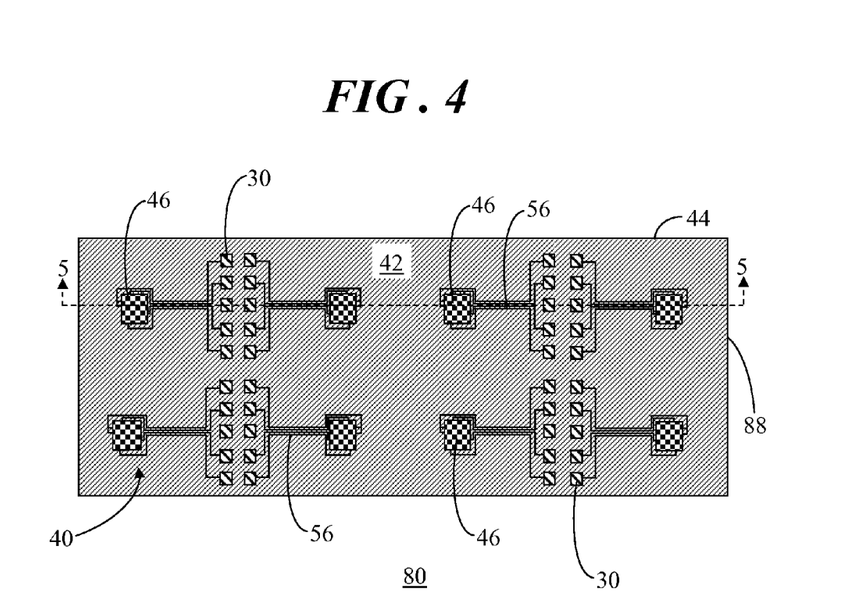
FIG. 4 shows a top view of a partial MEMS wafer at an initial stage of processing.
Figure 5:
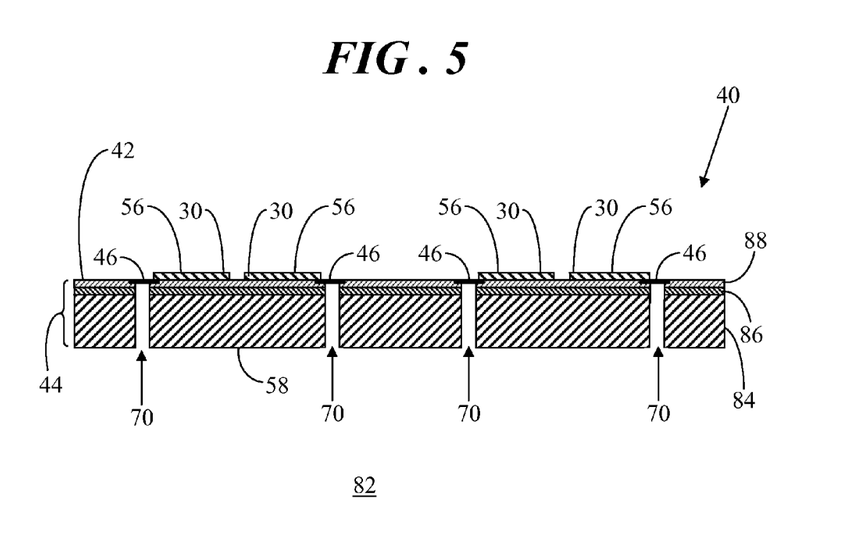
FIG. 5 shows a side sectional view of the partial MEMS wafer along section lines 5-5 of FIG. 4.

Referring to FIGS. 4 and 5 in connection with tasks 76 and 78, FIG. 4 shows a top view of a partial MEMS wafer at an initial stage of processing 80, and FIG. 5 shows a side sectional view of the partial MEMS wafer of FIG. 4 at a subsequent stage of processing 82. The side sectional view shown in FIG. 5 is taken along section lines 5-5 of the top view shown in FIG. 4. In an embodiment, fabrication processes may implement silicon on insulator technology (SOI). SOI technology refers to the use of a silicon-insulator-silicon substrate in lieu of conventional silicon substrates. SOI-based devices differ from conventional silicon-built devices in that the silicon junction is above an electrical insulator, typically silicon dioxide. In MEMS devices, SOI wafers may be used to fabricate piezoresistive pressure sensors because the thin silicon junction, or layer, can be used to form a diaphragm of the pressure sensor that is able to bow when pressure is applied. For other MEMS sensor configurations, the thin silicon junction may be used to form the active (moving) part of the sensor.

As best seen in FIG. 5, device structure 44 is an SOI-based wafer having a silicon (e.g., single crystal silicon) base layer 84, a silicon dioxide insulating layer 86, and a silicon (e.g., polysilicon) top layer 88. Fabrication processes may entail the diffusion, or implantation, of piezoresistive materials (not shown) into front side 42 of device structure 44, and in particular into silicon top layer 88, to form active regions 46 of MEMS devices 40 having diffusion resistors. Next, metal deposition, patterning, and etching may be performed to form bondwire pads 30 and conductive traces 56. Traces 56 may at least partially overly the diffusion resistors to form suitable electrical connections. Other fabrication activities may be performed per convention that are not discussed or illustrated herein for clarity of description.

With continued reference to FIG. 5 in connection with tasks 76 and 78, after MEMS devices 40, bondwire pads 30, and traces 56 are formed on device structure 44 in accordance with task 76, back side etching is performed on device structure 44 in accordance with task 78. Task 78 relates to one ore more etch processes performed from back side 58 of device structure 44 toward front side 42 of device structure 44. As known to those skilled in the art, a mask (not shown) may be used to cover or otherwise protect those regions of back side 58 that are not to be removed. As such, the mask provides a pattern for forming apertures 70 through device structure 44 underlying active regions 46 of MEMS devices 40. FIG. 5 represents the outcome of a back side removal, i.e., etching, process performed at task 78 that removes a material portion of device structure 44 to produce apertures 70 extending through device structure to active regions 46. The back side removal processes may be performed using any of a number of known and upcoming etching processes, such as a Deep Reactive Ion Etch (DRIE) technique, a Potassium Hydroxide (KOH) etch technique, or any other suitable technique. Following the back side etch operations of task 78, the thin silicon top layer remains to form the active region, and in this particular configuration, movable diaphragm 46.

With reference back to FIG. 3, following tasks 76 and 78, packaging process 74 continues with a task 90. At task 90, cap layer 38 (FIG. 2) is coupled to front side 42 (FIG. 4) of device structure 44. A task 92 is performed following task 90. At task 92, an etch process is performed through cap layer 38 and device structure 44 to form cantilevered platforms 48.

Figure 6:
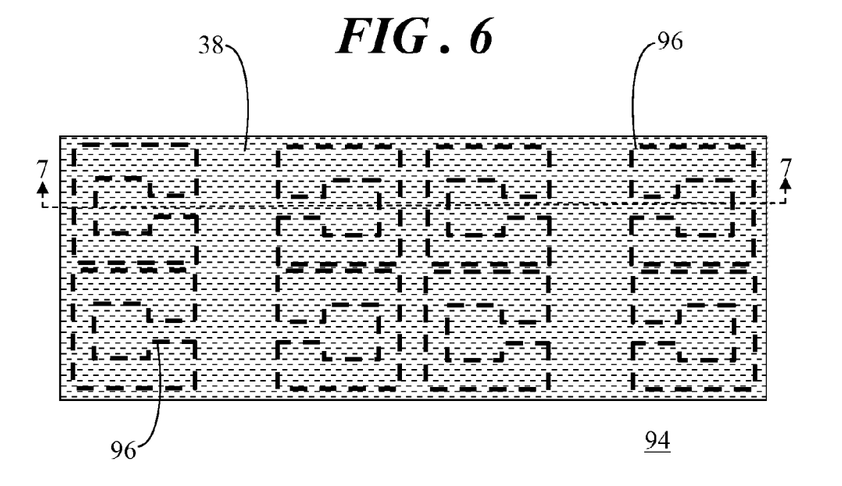
FIG. 6 shows a top view of the structure of FIGS. 4 and 5 at a subsequent stage of processing.
Figure 7:
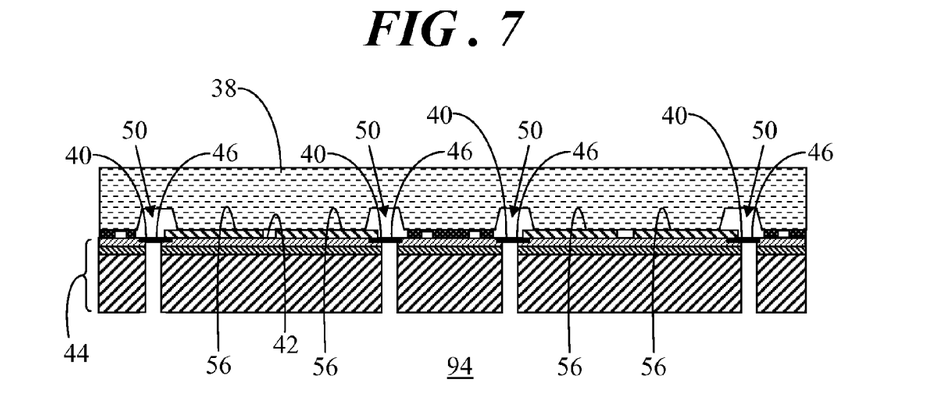
FIG. 7 shows a side sectional view of the structure along section lines 7-7 of FIG. 6.

Referring now to FIGS. 6 and 7 in connection with task 90, FIG. 6 shows a top view of the structure of FIG. 5 at a subsequent stage of processing 94, and FIG. 7 shows a side sectional view of the structure along section lines 7-7 of FIG. 6. As shown, cap layer 38 is coupled to front side 42 of device structure 44. Cap layer 38 may be attached to device structure 44 using any suitable attachment process and material known to those skilled in the art (e.g., glass frit bonding, silicon fusion bonding, metal eutectic bonding, anodic bonding, thermal compression bonding, and so forth).

FIG. 6 is provided with exemplary dashed lines representing seal areas 96 at which bonding of cap layer 38 to device structure 44 is to occur. Bonding may only occur at seal areas 96 so that the bond material is absent from the areas that will be etched to form trenches 54 (FIG. 1) in accordance with task 92 (FIG. 3). That is, a DRIE etch process can go all the way through those areas of the stacked cap layer 38 and device structure 44 that do not have the bond material. Accordingly, an etch process can be efficiently performed all the way through cap layer 38 and device structure 44 without stopping.

Figure 8:
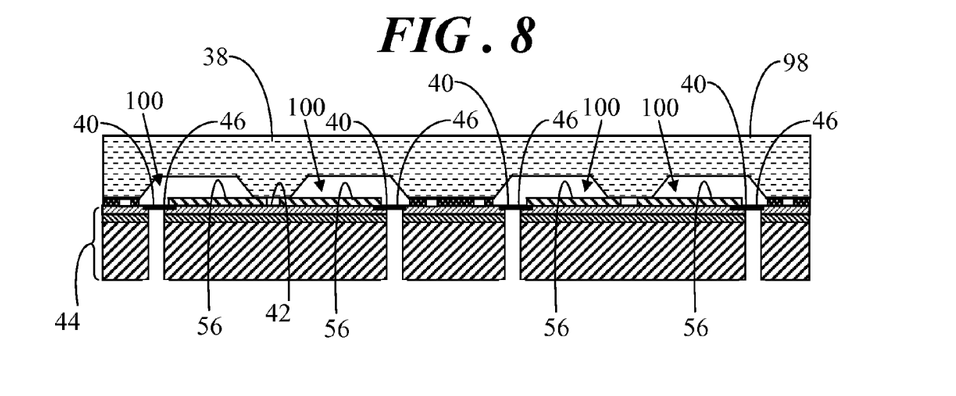
FIG. 8 shows a side sectional view of the structure of FIGS. 4 and 5 in accordance with another embodiment.

Now referring to FIGS. 7 and 8, FIG. 8 shows a side sectional view of the structure of FIGS. 4 and 5 in accordance with another embodiment. As particularly shown in FIG. 7, interior cavities 50 formed in cap layer 38 are aligned with the active regions, i.e., movable diaphragms 46, for each MEMS device 40. Interior cavities 50 shown in FIG. 7 provide a gap, or air space, between cap layer 38 and respective active regions 46 of each of MEMS devices 40. In some embodiments, it may be useful to additionally provide a gap, or air space, between the cap layer and conductive traces 56 formed at front side 42 of device substrate 44. Accordingly, FIG. 8 shows a cap layer 98 having interior cavities 100, each of which is large enough to provide a gap or air space, between cap layer 98 and the underlying active regions 46 and conductive traces 56.

Under some conditions, exposed conductive traces 56 may be susceptible to corrosion or leakage due to contamination. Accordingly, conductive traces 56 are sealed under cap layer 38 or cap layer 98. However, the larger air gap provided by interior cavities 100 of cap layer 98 may be useful because it may provide for lower parasitic capacitance in conductive traces 56. In either instance, cap layer 38 or cap layer 98 provides a cavity (interior cavity 50 or interior cavity 100) which seals off the sensitive electrical elements of MEMS device 40 from contaminants in external environment 68 (FIG. 2). In addition, this sealed cavity (either interior cavity 50 or interior cavity 100) can be vacuum sealed in order to make MEMS device 40 an absolute pressure sensor.

Figure 9:
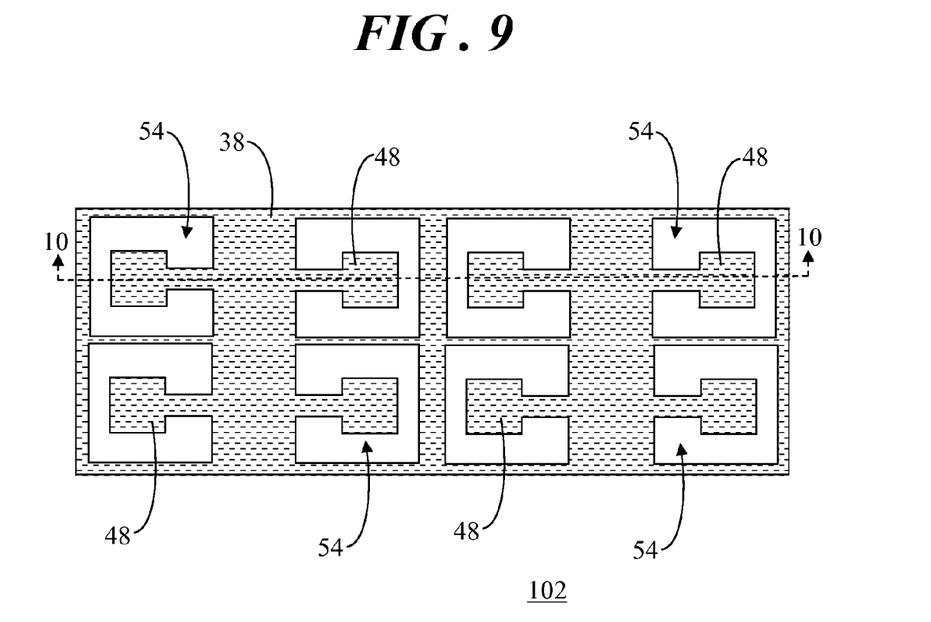
FIG. 9 shows a top view of the structure of FIGS. 6 and 7 at a subsequent stage of processing.
Figure 10:
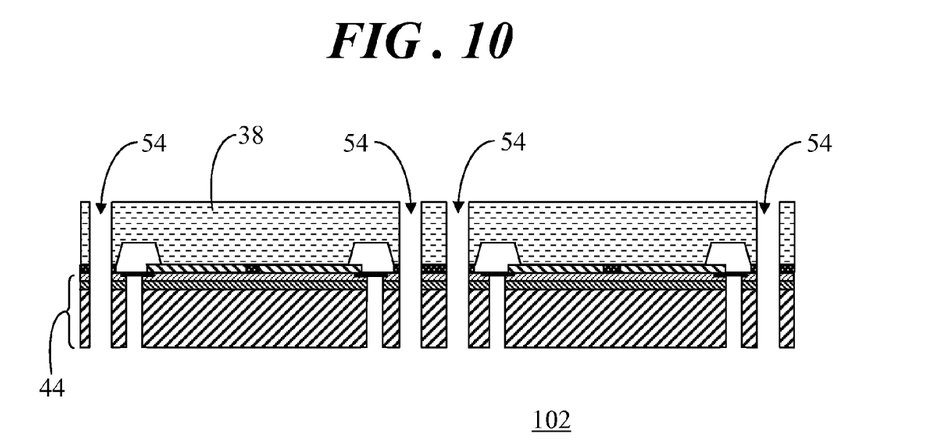
FIG. 10 shows a side sectional view of the structure along section lines 10-10 of FIG. 9.

Referring now to FIGS. 9 and 10 in connection with etching task 92 of packaging process 74 (FIG. 3), FIG. 9 shows a top view of the structure of FIGS. 6 and 7 at a subsequent stage of processing 102 and FIG. 10 shows a side sectional view of the structure along section lines 10-10 of FIG. 9. FIGS. 9 and 10 represent the outcome of the removal, i.e., etching, process performed at task 92 that removes an entire thickness of the stacked cap layer 38 and substrate structure 44 and thereby produces cantilevered platforms 48, each of which is surrounded by trench 54. Again, the etching process of task 92 may be performed using any of a number of known and upcoming etching processes, such as a Deep Reactive Ion Etch (DRIE) technique, a Potassium Hydroxide (KOH) etch technique, or any other suitable technique.

With reference back to packaging process 74 (FIG. 3), process control continues with a task 104. At task 104, bondwire pads 30 are exposed out of cap layer 38. A task 106 is performed in conjunction with task 104. At task 106, a panel of MEMS dice 22 is separated to form individual MEMS dice 22.

Figure 11:
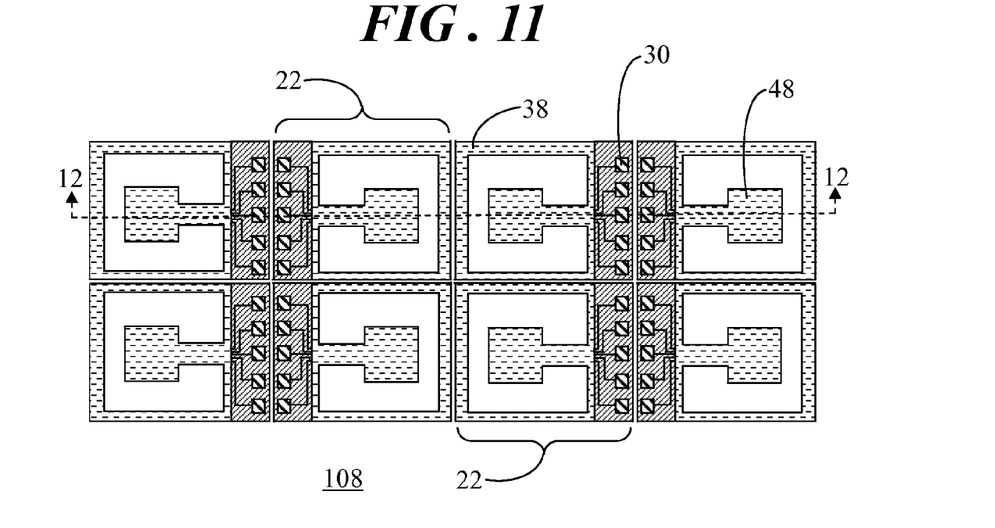
FIG. 11 shows a top view of the structure of FIGS. 9 and 10 at a subsequent stage of processing.
Figure 12:
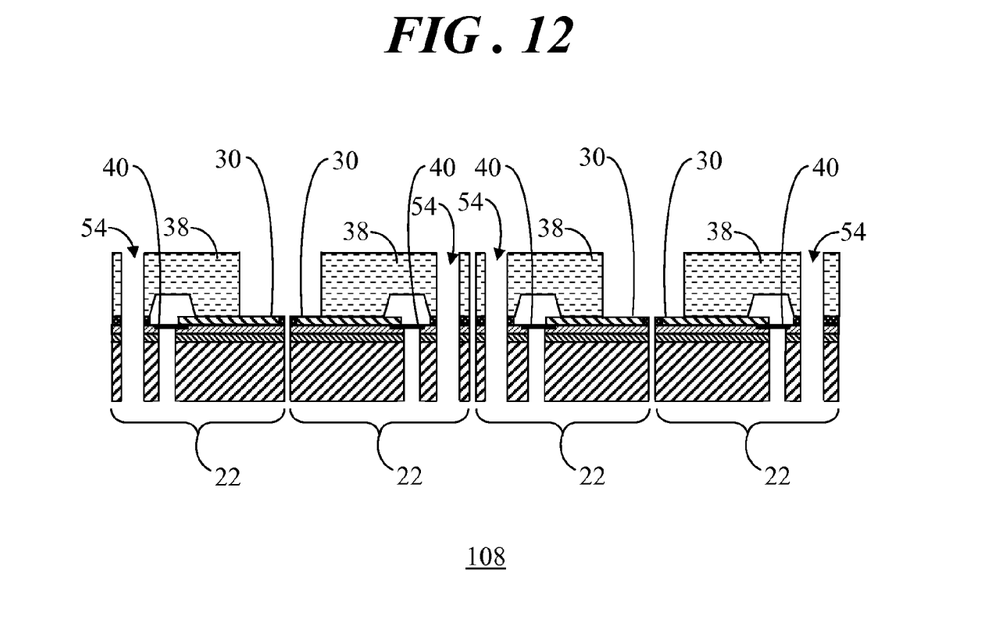
FIG. 12 shows a side sectional view of the structure along section lines 12-12 of FIG. 11.

Referring to FIGS. 11 and 12 in connection with tasks 104 and 106, FIG. 11 shows a top view of the structure of FIGS. 9 and 10 at a subsequent stage of processing 108, and FIG. 12 shows a side sectional view of the structure along section lines 12-12 of FIG. 11. Through the execution of the aforementioned tasks, a panel or wafer of MEMS dice 22, each including at least one MEMS device 40 is produced. FIGS. 11 and 12 represent the outcome of a reveal process performed at task 104 and a panel separation process performed at task 106. In accordance with task 104, a portion of cap layer 38 is sawn, etched, or otherwise removed to reveal bondwire pads 30. Additionally, the panel of MEMS dice 22 has been sawn, diced, or otherwise separated to form individual MEMS dice 22, each of which includes at least one MEMS device 40 protected by cap layer 38.

With reference back to FIG. 3, packaging process 74 continues with a task 110. At task 110, a base substrate is provided. In an embodiment, the base substrate may be base structure 26 (FIG. 2) in the form of a generally planar wafer, leadframe, and the like. However, the base substrate need not have the planar construct of base structure 26.

Figure 13:
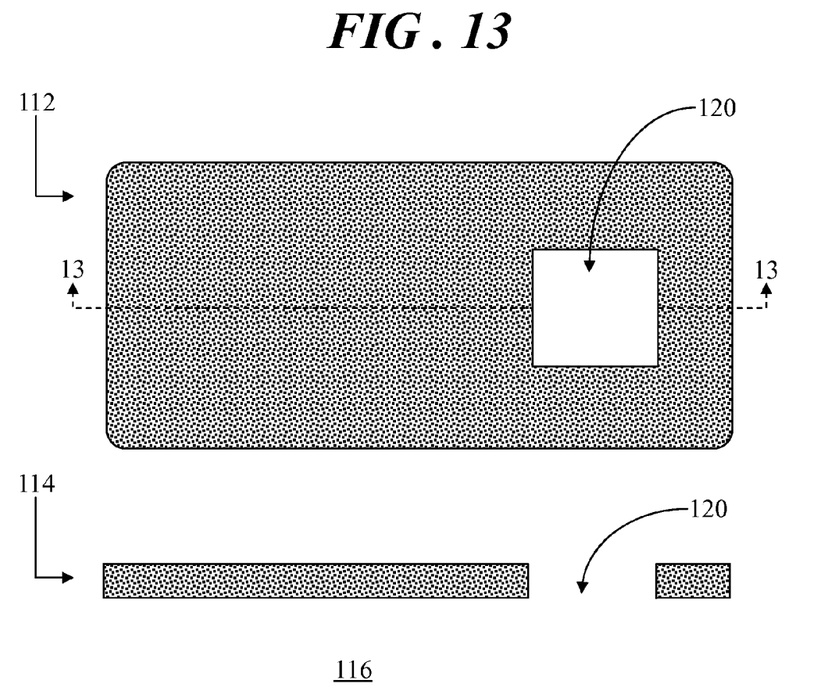
FIG. 13 shows a top view and a side sectional view of a base structure for the MEMS chip of FIGS. 1 and 2.
Figure 14:
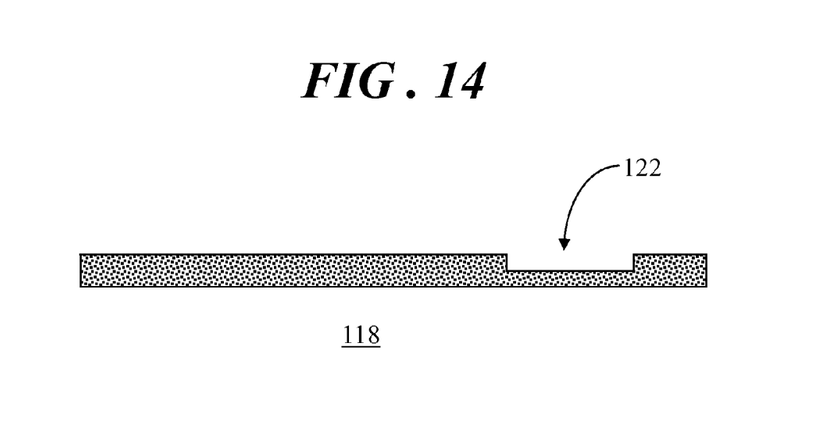
FIG. 14 shows a side view of a base structure for the MEMS chip of FIGS. 1 and 2 in accordance with another embodiment.

Referring to FIGS. 13 and 14 in connection with task 110, FIG. 13 shows a top view 112 and a side sectional view 114 of a base structure 116 for MEMS chip 20 (FIG. 1) in accordance with an alternative embodiment. Side sectional view 114 is taken along section lines 13-13 of top view 112 in FIG. 13. FIG. 14 shows a side view of a base structure 118 in accordance with another embodiment.

In the embodiment of FIG. 13, base structure 116 includes a cutout 120 extending through an entire thickness of base structure 116. Once assembled, cutout 120 underlies cantilevered platform 48 (FIGS. 1-2) to produce some or all of clearance space 60 (FIG. 2) between cantilevered platform 48 and base structure 116. Additionally, cutout 120 can function as a port for exposing diaphragm 46 (FIG. 2) of MEMS device 40 (FIG. 2) to external environment 68 (FIG. 2). For example, cutout 120 may be contiguous, or approximately aligned, with aperture 70 (FIG. 2) so that diaphragm 46 is exposed to external environment 68 via cutout 120 and aperture 70.

In the embodiment of FIG. 14, base structure 118 includes a cutout 122 extending partially through the thickness of base structure 118. Thus, once assembled cutout 122 underlies cantilevered platform 48 to produce clearance space 60 between cantilevered platform 48 and base structure 118. However, since cutout 122 only partially extends through the thickness of base structure 118, diaphragm 46 is not exposed to external environment 68 via cutout 122. Cutout 120 (FIG. 13) and cutout 122 may be suitably configured in various shapes and sizes. Alternatively, a base structure may include a cutout extending partially through the thickness of the base substrate, as well as a smaller port extending through the thickness of the base structure in this cutout region.

With reference back to FIG. 3, packaging process 74 continues with a task 124. At task 124, MEMS die 22 (FIG. 2) and integrated circuit die 24 (FIG. 2) are coupled to the base structure. In the example of FIGS. 1 and 2, MEMS die 22 and integrated circuit die 24 may be attached to base structure 26 using adhesive 28, e.g., epoxy, solder, and so forth (FIG. 2). In alternative embodiments, MEMS die 22 and integrated circuit die 24 may be attached to base structure 116 (FIG. 13) or base structure 118 (FIG. 14) in accordance with known and upcoming techniques.

Following the coupling operation 124, packaging process 74 continues with a task 126. At task 126, each MEMS die 22 (FIG. 2) is electrically interconnected with its integrated circuit die 24 (FIG. 2) via conductive interconnects 34 (FIG. 2). For example, a wirebonding process may be performed to form external connections between bondwire pads 30 (FIG. 1) of MEMS die 22 and bondwire pads 32 (FIG. 1) of integrated circuit die 24 using conductive interconnects 34.

Next, a task 128 is performed. At task 128, a plug element is positioned over that portion of cap layer 38 overlying MEMS device 40 of MEMS die 22. Task 128 and subsequent operations are performed when MEMS chip 20 (FIG. 1) is to be fully encapsulated with a molding compound, i.e., overmolded. In other embodiments, however, MEMS chip 20 may be housed as a cavity package. In such cavity package configuration, tasks 128 and subsequent operations may not be performed.

Figure 15:
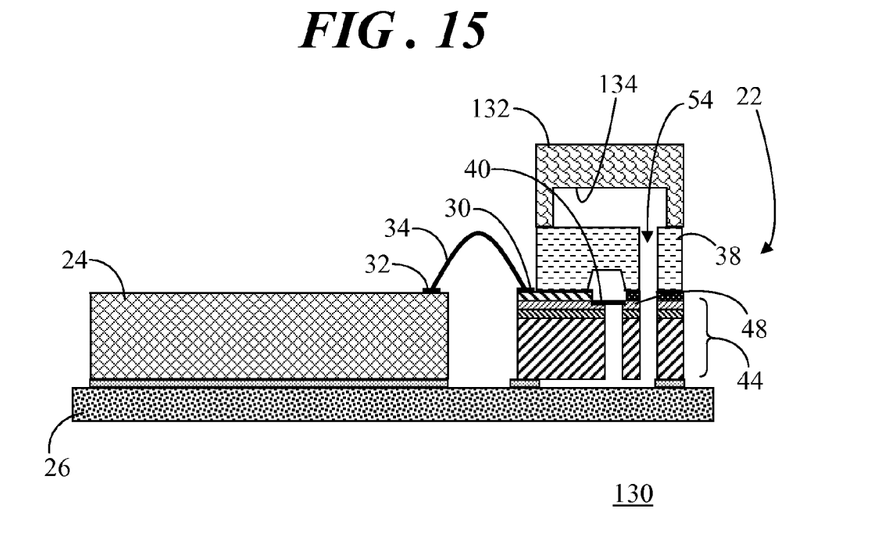
FIG. 15 shows a side sectional view of the structure of FIGS. 11 and 12 at a subsequent stage of processing.

Referring to FIG. 15 in connection with task 128, FIG. 15 shows a side sectional view of the structure of FIGS. 11 and 12 at a subsequent stage of processing 130. As shown, a plug element 132 is positioned over cap layer 38 overlying MEMS device 40 of MEMS chip 22. Plug element 132 is sufficiently large to additionally cover trench 54 surrounding cantilevered platform 48. However, integrated circuit 24, bondpads 30, bondpads 32, and interconnects 34 remain exposed from plug element 132. Plug element 132 may be a conventional molding pin and, in some embodiments, plug element 132 may have a depressed area 134 so that an inner surface of plug element 132 avoids contact with cap layer 38.

With reference back to FIG. 3, following task 128, a task 136 is performed. At task 136, molding compound 36 is applied to the assembly that includes MEMS die 22, integrated circuit die 24, and base structure 26.

Figure 16:
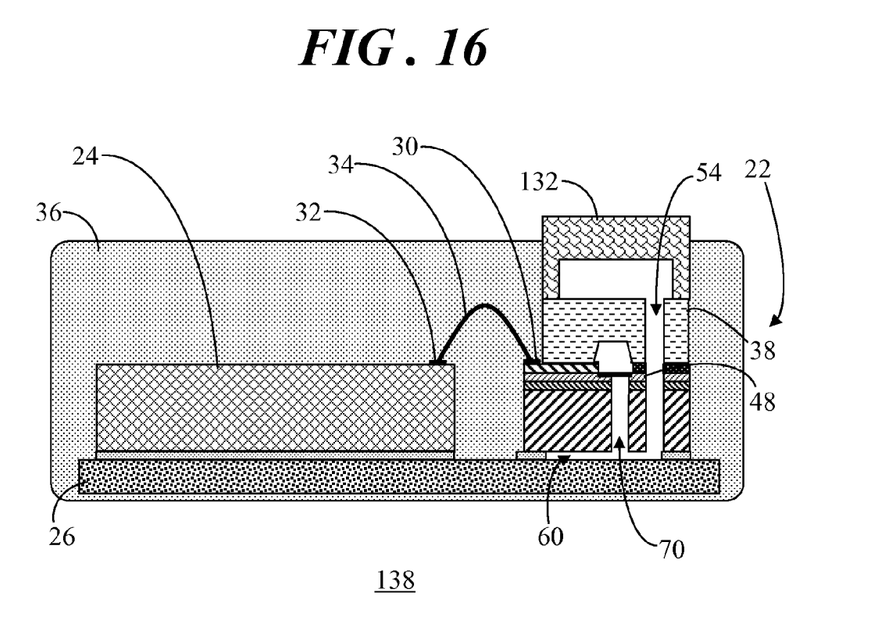
FIG. 16 shows a side sectional view of the structure of FIG. 15 at a subsequent stage of processing.

Referring to FIG. 16 in connection with task 136, FIG. 16 shows a side sectional view of the structure of FIG. 15 at a subsequent stage of processing 138. Molding compound 36 encapsulates base structure 26, MEMS die 22, integrated circuit die 24, bondwire pads 30 and 32, conductive interconnects 34, and plug element 132. However, plug element 132 is sufficiently high so that a portion of plug element 132 extends beyond the thickness of molding compound 36. Plug element 132 overlying MEMS device 40 and trench 54 prevents a flow of molding compound 36 into trench 54 surrounding cantilevered platform 48 and into clearance space 60.

With reference back to FIG. 3, following encapsulation task 136, packaging process 74 continues with a task 140. At task 140, plug element 132 (FIG. 15) is removed so that opening 64 (FIG. 1) in molding compound 36 at least temporarily remains in its place over MEMS die 22.

Next, a task 142 is performed. At task 142, a cap, such as protective cap 62 shown in FIG. 2 is positioned in opening 64. Cap 62 is molded in place, or otherwise coupled to, substrate cap layer 38 with, for example, an adhesive or epoxy material. However, as mentioned previously, cap 62 can include port 66 so that the active region, i.e. back side 72 (FIG. 2) of diaphragm 46 (FIG. 2) is exposed to external environment 68 (FIG. 2) by way of port 66, trench 54, clearance space 60, and aperture 70 (FIG. 2). Following task 142, packaging process 74 exits. The simplified flow of packaging process 74 can achieve savings in process operations. In addition, the packaging process yields a product, i.e. MEMS chip 20 having a MEMS die 22, with the MEMS die including a pressure transducer device 40. The MEMS pressure transducer device 40 is less likely to be adversely affected by particles or other contaminants in external environment 68 because only the back side of movable diaphragm 46 is exposed to the contaminants. That is, the piezoresistors, conductive traces, and so forth are encapsulated in a sealed cavity and are therefore less likely to fail in a contaminated environment.

Figure 17:
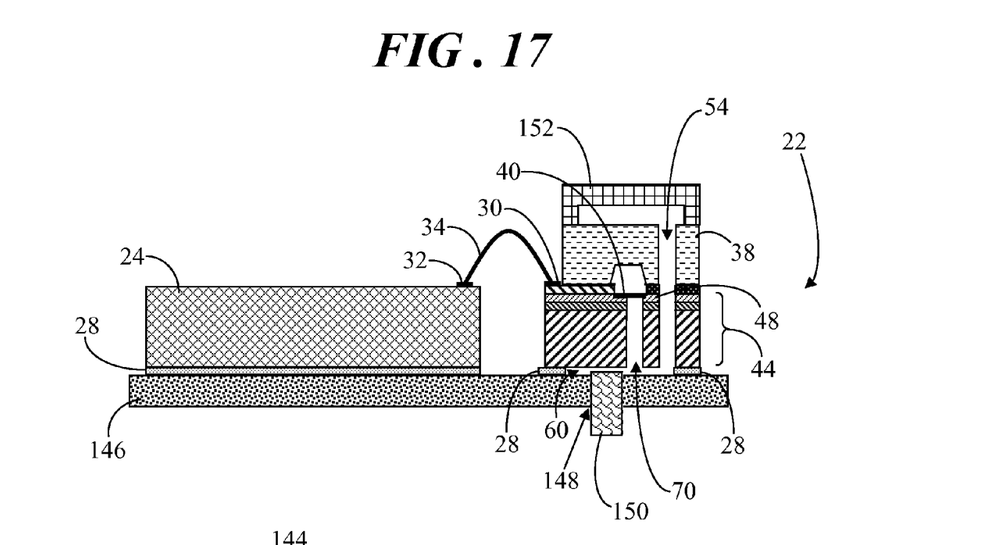
FIG. 17 shows a side sectional view of a MEMS chip at an intermediate stage of processing in accordance with another embodiment.
Figure 18:
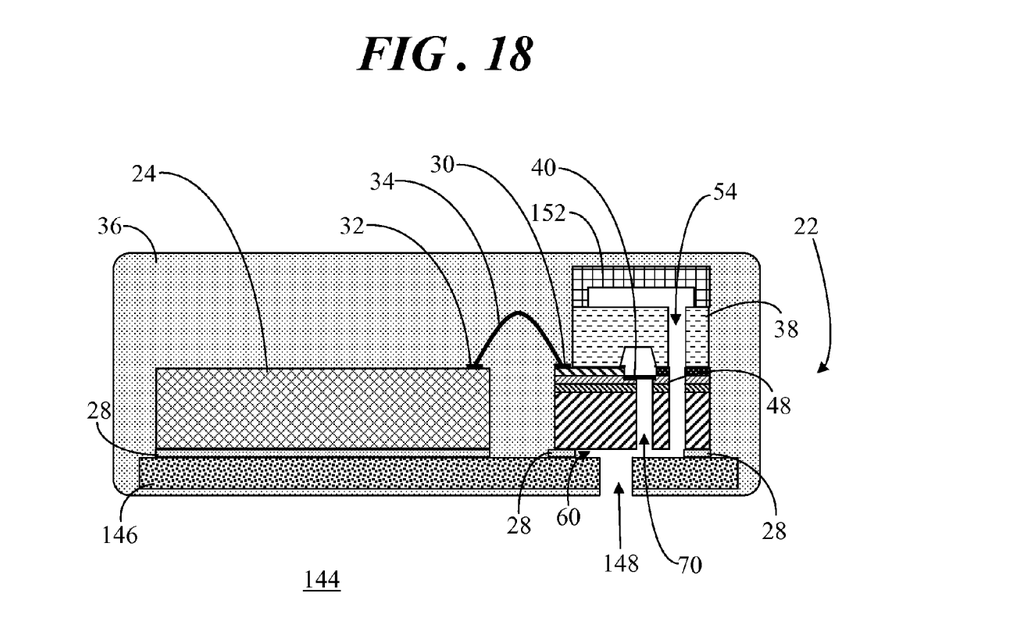
FIG. 18 shows a side sectional view of the MEMS chip of FIG. 17.

Referring to FIGS. 17 and 18, FIG. 17 shows a side sectional view of a MEMS chip 144 at an intermediate stage of processing in accordance with another embodiment, and FIG.

18 shows a side sectional view of MEMS chip 144 farther along in processing. Like MEMS chip 20 (FIG. 1), MEMS chip 144 includes MEMS die 22 and integrated circuit die 24 electrically interconnected via conductive interconnects 34. In the illustrated embodiment, MEMS die 22 and integrated circuit die 24 are attached to a base structure 146 using adhesive 28 so that clearance space 60 is formed between cantilevered platform 48 and base structure 146. Base structure 146 additionally includes a cutout or port 148 underlying cantilevered platform 48. As shown in FIG. 17, a plug element 150 is positioned in port 148.

In addition, MEMS chip 144 includes a cap 152 in lieu of protective cap 62 (FIG. 2). Cap 152 covers trench 54 and cap layer 38 overlying cantilevered platform 48. Unlike protective cap 62, cap 152 does not include an opening or port. Following placement of both plug element 150 and cap 152, the structure is encapsulated molding compound 36. Molding compound 36 encapsulates base structure 146, MEMS die 22, integrated circuit die 24, bondwire pads 30 and 32, conductive interconnects 34, cap 152, and plug element 150.

Cap 152 prevents a flow of molding compound 36 into trench 54. Plug element 150, placed in port 148, prevents a flow of molding compound 36 into clearance space 60 underlying cantilevered platform 48 and into aperture 70 and/or trench 54. However, plug element 150 is sufficiently long so that a portion of plug element 150 extends beyond the thickness of molding compound 36. After being encapsulated in molding compound 36, plug element 150 can be removed, but cap 152 remains in place. Thus, the active region of MEMS device 40, i.e. back side 72 (FIG. 2) of diaphragm 46, is exposed to external environment 68 by way of port 148, clearance space 60, and aperture 70. In an actual implementation in which MEMS chip 144 is mounted to, for example, a printed circuit board (PCB), the PCB may include an opening corresponding to port 148.

MEMS chip 20 (FIG. 2) represents a configuration in which a port to external environment 68 is formed on the top of MEMS chip 20. MEMS chip 144 (FIG. 18) represents a configuration in which a port to external environment 68 is formed in the bottom of MEMS chip 144. In other embodiments, there may be ports to external environment 68 formed in both the top and the bottom of the MEMS chip in accordance with particular design constraints.

Embodiments described herein comprise compact MEMS device assemblies, i.e., MEMS chips, that include one or more integrated circuit dice and one or more MEMS dice. A MEMS die includes a cantilevered platform upon which a MEMS device resides. This cantilevered platform achieves the benefit of improved package stress isolation. A MEMS device disclosed herein comprises a pressure transducer in which the back side of a movable diaphragm residing on the cantilevered platform is exposed to an external environment and the sensitive electrical components and traces are isolated from the external environment in a sealed cavity. The methodology additionally allows for the use of low-cost overmolded packaging or cavity packaging that provides the appropriate environmental protection of the MEMS devices without affecting the mechanical motion of the moving parts of the MEMS devices. Accordingly, the MEMS pressure transducer assemblies and packaging methodology achieve the advantages of good device performance, small device size, inexpensive overmolded packaging, and adaptation to a variety of MEMS packaging needs.

Although the preferred embodiments of the invention have been illustrated and described in detail, it will be readily apparent to those skilled in the art that various modifications may be made therein without departing from the spirit of the invention or from the scope of the appended claims. That is, it should be appreciated that the exemplary embodiments are only examples, and are not intended to limit the scope, applicability, or configuration of the invention.

What is claimed is:

1. An assembly comprising:
   a device structure having a cantilevered platform formed therein, wherein a trench extends through said device structure surrounding said cantilevered platform;
   a microelectromechanical systems (MEMS) device formed at a front side of said device structure, said MEMS device having an active region residing on said cantilevered platform, and an aperture extends through said device structure underlying said active region of said MEMS device; and
   a cap layer coupled to said front side of said device structure overlying said MEMS device, wherein at least a portion of said cap layer is attached to said cantilevered platform to form a sealed cavity in which said active region is located.

2. The assembly of claim 1 wherein said MEMS device comprises a pressure transducer, said pressure transducer including a movable diaphragm in said active region, said movable diaphragm being exposed to an external environment via said aperture.

3. The assembly of claim 2 wherein said movable diaphragm is movable relative to said cantilevered platform.

4. The assembly of claim 1 wherein said cantilevered platform has a sole attachment point to said device structure surrounding said cantilevered platform.

5. The assembly of claim 1 further comprising a base substrate attached to a back side of said device structure such that a clearance space is formed between said cantilevered platform and said base substrate, said cantilevered platform being suspended above said base substrate.

6. The assembly of claim 5 further comprising an adhesive attaching said back side of said device structure to said base substrate, said adhesive having a thickness sufficient to produce said clearance space underlying said cantilevered platform.

7. The assembly of claim 5 wherein said trench additionally extends through said cap layer surrounding said cantilevered platform, said clearance space and said aperture are in communication with said trench, and said active region is exposed to an external environment via said trench, said clearance space, and said aperture.

8. The assembly of claim 7 further comprising a protective cap over said trench and said cap layer overlying said cantilevered platform, wherein said protective cap includes a port extending through said protective cap to expose said trench to said external environment.

9. The assembly of claim 5 wherein said base substrate includes a cutout in said base substrate to produce said clearance space.

10. The assembly of claim 9 wherein said cutout extends through an entirety of said base substrate so that said active region is exposed to an external environment via said cutout, said clearance space, and said aperture.

11. The assembly of claim 1 wherein said MEMS device includes conductive traces formed at said front side of said device structure, and said cap layer covers said conductive traces such that said conductive traces reside in said sealed cavity.

12. The assembly of claim 11 wherein said sealed cavity is sized to provide a gap between said cap layer and said conductive traces.

13. An assembly comprising:
a device structure having a cantilevered platform formed therein, wherein a trench extends through said device structure surrounding said cantilevered platform, and said cantilevered platform has a sole attachment point to said device structure surrounding said cantilevered platform;
a microelectromechanical systems (MEMS) device formed at a front side of said device structure, said MEMS device having an active region residing on said cantilevered platform, and an aperture extends through said device structure underlying said active region of said MEMS device, wherein said MEMS device comprises a pressure transducer, said pressure transducer including a movable diaphragm in said active region, said movable diaphragm being exposed to an external environment via said aperture; and
a cap layer coupled to said front side of said device structure overlying said MEMS device, wherein at least a portion of said cap layer is attached to said cantilevered platform to form a sealed cavity in which said movable diaphragm is located.

14. The assembly of claim 13 wherein said movable diaphragm is movable relative to said cantilevered platform.

15. The assembly of claim 13 wherein said MEMS device includes conductive traces formed at said front side of said device structure, and said cap layer covers said conductive traces such that said conductive traces reside in said sealed cavity.

16. The assembly of claim 15 wherein said sealed cavity is sized to provide a gap between said cap layer and said conductive traces.

17. An assembly comprising:
a device structure having a cantilevered platform formed therein, wherein a trench extends through said device structure surrounding said cantilevered platform;
a microelectromechanical systems (MEMS) device formed at a front side of said device structure, said MEMS device having an active region residing on said cantilevered platform, and an aperture extends through said device structure underlying said active region of said MEMS device;
a cap layer coupled to said front side of said device structure overlying said MEMS device, wherein said trench additionally extends through said cap layer surrounding said cantilevered platform, and at least a portion of said cap layer is attached to said cantilevered platform to form a sealed cavity in which said active region is located; and
a base structure attached to a back side of said device structure such that a clearance space is formed between said cantilevered platform and said base structure, said cantilevered platform being suspended above said base structure.

18. The assembly of claim 17 wherein said MEMS device comprises a pressure transducer, said pressure transducer including a movable diaphragm in said active region, said movable diaphragm being movable relative to said cantilevered platform, and said movable diaphragm being exposed to an external environment via said aperture.

19. The assembly of claim 17 wherein said clearance space and said aperture are in communication with said trench, and said active region is exposed to an external environment via said trench, said clearance space, and said aperture.

20. The assembly of claim 17 wherein said base structure includes a cutout extending through an entirety of said base structure so that said active region is exposed to an external environment via said cutout, said clearance space, and said aperture.

* * * * *